(12) United States Patent
Huang

(10) Patent No.: US 6,191,490 B1
(45) Date of Patent: Feb. 20, 2001

(54) SEMICONDUCTOR PACKAGE HAVING A SEPARATED DIE PAD

(75) Inventor: Chien-Ping Huang, Hsinchu (TW)

(73) Assignee: Siliconware Precision Industries, Co., Ltd., Taichung (TW)

(*) Notice: Under 35 U.S.C. 154(b), the term of this patent shall be extended for 0 days.

(21) Appl. No.: 09/009,586

(22) Filed: Jan. 20, 1998

(30) Foreign Application Priority Data

May 23, 1997 (TW) ............................................. 86106933

(51) Int. Cl.[7] .......................... H01L 23/495; H01L 23/48
(52) U.S. Cl. .................. 257/782; 257/676; 257/666; 257/680; 257/670; 257/669; 257/783; 257/447; 257/671; 257/672
(58) Field of Search ................................. 257/782, 666, 257/668–672, 674, 676, 680, 773, 774, 783, 792, 690, 692

(56) References Cited

U.S. PATENT DOCUMENTS

| | | | | |
|---|---|---|---|---|
| 4,884,124 | * | 11/1989 | Mori et al. | 257/676 |
| 5,223,740 | * | 6/1993 | Ishikawa et al. | 257/676 |
| 5,233,222 | * | 8/1993 | Djennas et al. | 257/676 |
| 5,264,730 | * | 11/1993 | Matsuzaki et al. | 257/676 |
| 5,327,008 | * | 7/1994 | Djennas et al. | 257/676 |
| 5,521,428 | * | 5/1996 | Hollingsworth et al. | 257/670 |
| 5,550,402 | * | 8/1996 | Nicklaus | 257/669 |
| 5,661,338 | * | 8/1997 | Yeo et al. | 257/676 |
| 5,683,944 | * | 11/1997 | Joiner et al. | 257/676 |
| 5,723,897 | * | 3/1998 | Shin | 257/470 |
| 5,963,782 | * | 10/1999 | Webb | 438/15 |
| 6,049,120 | * | 4/2000 | Otani et al. | 257/667 |

\* cited by examiner

*Primary Examiner*—Alexander O. Williams
(74) *Attorney, Agent, or Firm*—Sawyer Law Group LLP

(57) ABSTRACT

This invention relates to a semiconductor package having a separated die pad, which is comprised of an integrated circuit chip having a plurality or bonding pads mounted on its surface; a die pad providing its upper surface for the chip to be attached to, which comprises the first plate and second plates disposed a space apart, and an adhesive film attached to the under surface of the first and second plates; a plurality of leads, the near end portions of the leads which can be electrically connected to the bonding pads of the chip, wherein the far end portions are exposed to the exterior surface of the semiconductor package; and a package body made of insulating material, wherein the chip, the die pad and the leads including parts of their near end portions are encapsulated. Such semiconductor package having a separated die pad is capable of reducing the material used to make the die pad, providing better stress absorption, and effectively preventing the chip and the die pad from resulting in crack and delamination, while by means of using adhesive film, preventing the silver paste which attaches the chip to the die pad from bleeding downwards.

16 Claims, 3 Drawing Sheets

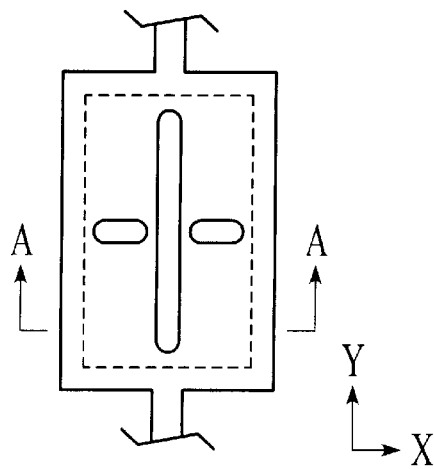
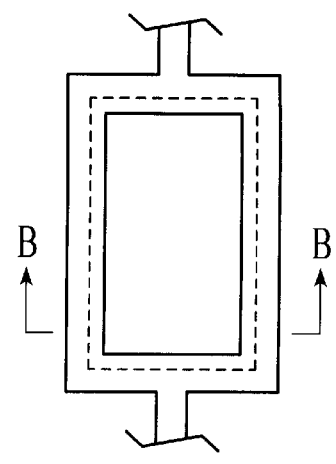
FIG. 3A (PRIOR ART)   FIG. 4A (PRIOR ART)
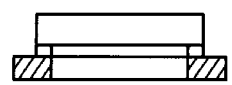
FIG. 3B (PRIOR ART)   FIG. 4B (PRIOR ART)
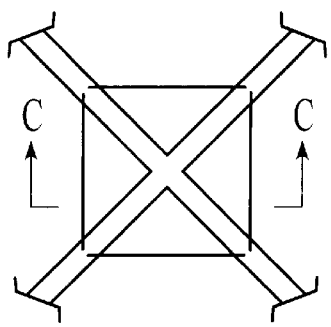
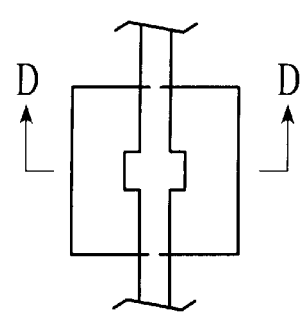
FIG. 5A (PRIOR ART)   FIG. 6A (PRIOR ART)
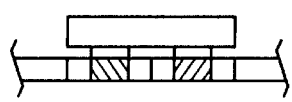
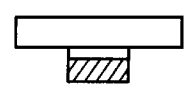
FIG. 5B (PRIOR ART)   FIG. 6B (PRIOR ART)

SEMICONDUCTOR PACKAGE HAVING A SEPARATED DIE PAD

FIELD OF THE INVENTION

This invention relates to a semiconductor package having a separated die pad, in particular, to a semiconductor package having a separated die pad to be mounted on a printed circuit board (PCB).

BACKGROUND OF THE INVENTION

The structure of a typical semiconductor package is comprised of a semiconductor chip 1A, a die pad 2A, leads 3A and a package body 4A, as shown in FIGS. 1 and 2. In order to attach chip 1A to die pad 2A, a layer of silver paste 5A can be applied between semiconductor chip 1A and die pad 2A. Different coefficients of thermal expansion exist for the chip 1A, the silver paste 5A, the die pad 2A and packaging resins forming the package body 4A, since the materials used to make them are different.

The steps of die attaching, molding and post mold curing are performed under a high temperature environment of from 150° C. to 175° C. during the packaging of semiconductor units. The differences in the coefficients of thermal expansion of the chip, die pad, silver paste and packaging resin result in the variations of thermal stress by heating and cooling during the packaging process. Accordingly, crack and delamination occur between chip 1A and package body 4A, chip 1A and silver paste 5A, silver paste 5A and the upper surface of die pad 2A, and also between the bottom surface of die pad 2A and package body 4A in the finished semiconductor package, thus deleteriously affecting the reliability of the products.

In addition, recently, high speed and multi-functions developments have been made in computer-based electronic products. Therefore, the capacity of the chips has had to be increased. In order to match the tendency in increasing chip capacity efforts must be made in making larger chips. When the size of the chips is increased, the die pad becomes accordingly larger, and the amount of silver paste coated thereon has to be increased as well. The larger the chips, die pad and silver paste, the greater the thermal stress. With increased thermal stress, the phenomena of cracking and delamination on the finished semiconductor packages also occur easier. Thus, the quality reliability of the products is significantly lowered.

One of the approaches in resolving the above-mentioned problem is to change the design of the die pad, such that the stress effect can be decreased. Various modified die pads are described in detail as follows:

1. Open-Slot Type

As shown in FIG. 3(A), a plurality of slots (or holes) were opened on the die pad to enhance the holding force of the die pad. The stresses are enabled to be absorbed by these slots, so that the disadvantageous effects produced on the die pad by the stress between chips and the die pad and between the die pad and the packaging resin are decreased. Thus, the occurrence of crack and delamination is reduced. However, as shown in FIG. 3(B), since there are a number of slots on such die pad, when chips are attached to the die pad, in order to prevent the silver paste from bleeding through these slots and contaminating the packaging equipment, or even resulting in cracking or secondary delamination, the pasting amount and pasting position of the silver paste must be severely controlled. In order to strictly control the pasting amount and pasting position of the silver paste, the pasting head must be particularly designed. Therefore, not only is the producing cost increased, the bleeding problem of the silver paste still cannot be entirely eliminated. Thus, there are some improvements that have to be made for this type of die pad, to prevent too much pasting from resulting in bleeding. Improvements have to be made to prevent not enough pasting affecting the attachment of the chip to the die pad, or improper pasting leaving spaces between the chip and the die pad resulting in the forming of voids during the molding or injection process, such that cracks or delamination easily occur between the chip and the die pad.

2. Hollow Type

As shown in FIG. 4(A), a rectangular trough is formed in the center of the die pad. Both the stress effects between chips and the die pad and between the die pad and packaging resin are decreased via reducing the area of the die pad and consequently reducing the amount of the silver paste needed. Meanwhile, the formation of the rectangular trough greatly reduces the material needed for the die pad; and provides better results for decreasing stress effect than the above mentioned open-slots type. Although the area of the die pad is greatly reduced, the problem of silver paste bleeding from the edge of the rectangular trough (see FIG. 4(B)) still exists. However, since the pasting amount and pasting position still have to be strictly controlled, complexity and difficulty of the process are increased. In addition, like the above mentioned open-slot die pad, not enough pasting or an improper pasting position will leave spaces between the chip and the die pad, form voids during the molding or injection process, and result in the occurrence of cracks. This can even result in a failure in the attachment between the chip and the die pad since parts of the chip and the die pad are not coated. Therefore, improvements still have to be made.

3. Crossed Type

As shown in FIG. 5(A), the die pad is comprised of two crossed pad plates. The material used for the crossed type die pad is reduced as compared to the hollow type; as well, the influence produced by the stress effect is decreased due to the reduction of the area and the shrinkage of the attachment area between the chip and the die pad. However, as shown in FIG. 5(B), the above mentioned problem of contaminating the packaging equipment resulted from bleeding of the silver paste and the problem of secondary delamination still exist. Meanwhile, when using this type of die pad, after die attaching, most of the circumference of the chip is not fully attached to the die pad. Since cracks may easily occur during the process of die attachment, this is not an ideal type of die pad.

4. Shrunken Type

As shown in FIG. 6(A), the die pad is basically comprised of a slug-like pad plate, with an enlarged portion formed in the approximate center position of said slug-like pad plate. Since the area of the shrunken type die pad is smaller than the crossed type, the cost of the material is less. As well, the smaller area receives a lesser impact from the remaining stress when compared to that of the crossed type. However, the problem of silver paste bleeding still exists and the amount of pasting still has to be strictly controlled (as shown in FIG. 6(B)) as in the above-mentioned other three die pads. Furthermore, since the area is smaller, the horizontal position of the attachment of the chip to the die pad must be carefully controlled during the die attachment process, such that the proper support and horizontal orientation of the chips can be obtained in order to meet the requirements of the wire bonding process.

In addition to the above mentioned problems, there is a common disadvantage in those disclosed four different types of die pad. That is, since the dimension of the conventional die pad along the longitudinal extension direction (Y direction as shown in FIG. 3(A)) of the tie bar attached thereon is longer, greater stress effect is produced when the temperature varies, easily resulting in the deformation of the die pad in the Y direction. The occurrence of this formation will cause cracks and delamination. This is a major defect that needs to solve.

SUMMARY OF THE INVENTION

In view of above, the primary, purpose of the present invention is to provide a semiconductor packaging having a separated die pad, which is capable of decreasing the stress effect of the die pad in the longitudinal extension direction of the attached tie bar, and capable of effectively increasing the stress absorption effect of the die pad in this direction.

Another purpose of the present invention is to provide a semiconductor packaging having a separated die pad, which is capable of effectively preventing the silver paste from bleeding and contaminating the equipment or resulting in secondary delamination.

Still another purpose of the present invention is to provide a semiconductor packaging having a separated die pad, without having to strictly control the amount of pasting and the pasting position during die attachment. In this way the packaging procedure can conveniently be performed.

A further purpose of the present invention is to provide a semiconductor packaging having a separated die pad, without having to strictly control the amount of pasting during die attachment. This allows a prevention of the production of spaces between the chip and the die pad or creating voids during the molding or injection process due to not enough pasting.

Still another purpose of the present invention is to provide a semiconductor packaging having a separated die pad, which is capable of not only reducing the material of the die pad, but also enabling the chip to obtain excellent support in the packaging.

A further purpose of the present invention is to provide a semiconductor packaging having a separated die pad, wherein the circumference of the chip can obtain support sufficient to ensuring that cracks will not occur when die attachment is in progress.

Still another purpose of the present invention is to provide a semiconductor packaging having a separated die pad, wherein an elastic buffer effect exists between the die pad and the packaging body.

DETAILED DESCRIPTION OF THE INVENTION

The semiconductor package, having a separated die pad of the present invention, is comprised of: an integrated circuit chip having a plurality of bonding pads mounted on its surface; a die pad providing its upper surface for the chip to be attached to, which comprises the separated first and second plates, and an adhesive film attached to the under surface of the first and second plates; a plurality of electrical leads, the near end portions of the leads which can be electrically connected to the bonding pads of the chip, wherein the far end portions are exposed to the exterior surface of the semiconductor package; and a package body made of insulating material, wherein the chip, the die pad and the leads including parts of their near end portions are encapsulated. The first and second plates of the die pad form a hollow portion in the center part; there are openings on the adjacent sides of the first and second plates for connecting to the hollow portions; tie bars are connected to the opposite sides of the opening, and the die pad is connected to a lead frame via the tie bars. In order to maintain the same level of the separated first and second plates of the die pad, an adhesive film is coated on the under surface of the die pad, so that the first and second plates can be kept on the same plane; thus, unwanted elevation or depression of the plates can be prevented. When the chip is attached to the upper surface of the die pad with silver paste, the coating of the adhesive film has the further effect of preventing silver paste from bleeding along the inner wall of the hollow portion surrounded by the first and second plates. Therefore, there is no concern about contamination of the equipment or secondary delamination. The process proceeds smoothly so that a good quality product can be obtained, and the cost can be contained. In addition, since the adhesive film is produced by materials such as polyimides, which may provide an elastic buffer between the under surface of the die pad and the material of the package body, stress can be reduced, and the resistance to crack (or delamination) can be increased. Meanwhile, as the adhesive film possesses at least one small hole, the packaging resin can be injected into the hollow portions of the die pad through the hole during the molding or injection process, so that the die pad and the chip attached thereto can be bonded firmly to the molded package body. The holes can be rectangular, or circular, etc., i.e., not limited in possible shape.

The segments on both sides of the opening of the first and second plates form precisely a pincerlike protrusions, such that the first and second plates can grapple the molded package body more firmly via the pincerlike protrusion, and the bonding effect between the package body and the die pad can be improved. Besides, the inner surface wall of the hollow portion surrounded by the first and second plates is not necessarily perpendicular to the extending plane of the first and second plates, that is, the cross section can be in the form of wedge structure, or the inner surface wall can be in an arc form, angular from, or rough in texture. Thus, the bonding effect between the package body and the die pad can further be increased.

In addition, the materials used to make the first and second plates of the die pad may be copper, copper alloy, an alloy of iron and nickel or a combination of these. Also, a thermal dissipator is attached to the under surface of the die pad to dissipate heat produced when the chip is activated.

The leads and the chip are connected via wires, which electrically connect the near ends of the lead to the bonding pad of the chip. The wires can be made of electrically conductive materials such as gold, copper, aluminum or an alloy of these. Further, the "near end" or "far end" of a lead is defined by the short or long distance from the chip to both ends, and the leads are attached to a lead flame before carrying out the de-junking/trimming process in the packaging process. As the lead also can be made of electrically conductive material, the material commonly used is copper, copper alloy, or an alloy of iron and nickel, etc.

The package body is made from molded plastic material. Either phenolic novolac epoxy resin, phenolic epoxy resin or other molding resin is commonly used.

The electrically conductive adhesive material used to attach the chip to the die pad is comprised of thermally conductive epoxy resin, sliver, or the like.

In another preferred embodiment according to the invention, at least one of the pincerlike protrusions in the semiconductor packaging has ribs oriented toward the hollow portion of the first and second plates of the separated die pad, which enhances the grappling relationship between the die pad and the package body.

The features and the effects of the present invention are described in detail by the following preferred embodiments with reference to the attached drawings.

BRIEF DESCRIPTION OF THE DRAWINGS

FIG. 3(A) is a plane view of a conventional "open-slot type" die pad with an attached chip;

FIG. 3(B) is a cross sectional view of FIG. 3(A) along A—A line;

FIG. 4(A) is a plane view of a conventional "hollow type" die pad with an attached chip;

FIG. 4(B) is a cross sectional view of FIG. 4(A) along B—B line;

FIG. 5(A) is a plane view of a conventional "cross type" die pad with an attached chip;

FIG. 5(B) is a cross sectional view of FIG. 5(A) along C—C line;

FIG. 6(A) is a plane view of a conventional "shrunken type" die pad with an attached chip;

FIG. 6(B) is a cross sectional view of FIG. 6(A) along D—D line;

EXAMPLE 1

Figure 1:
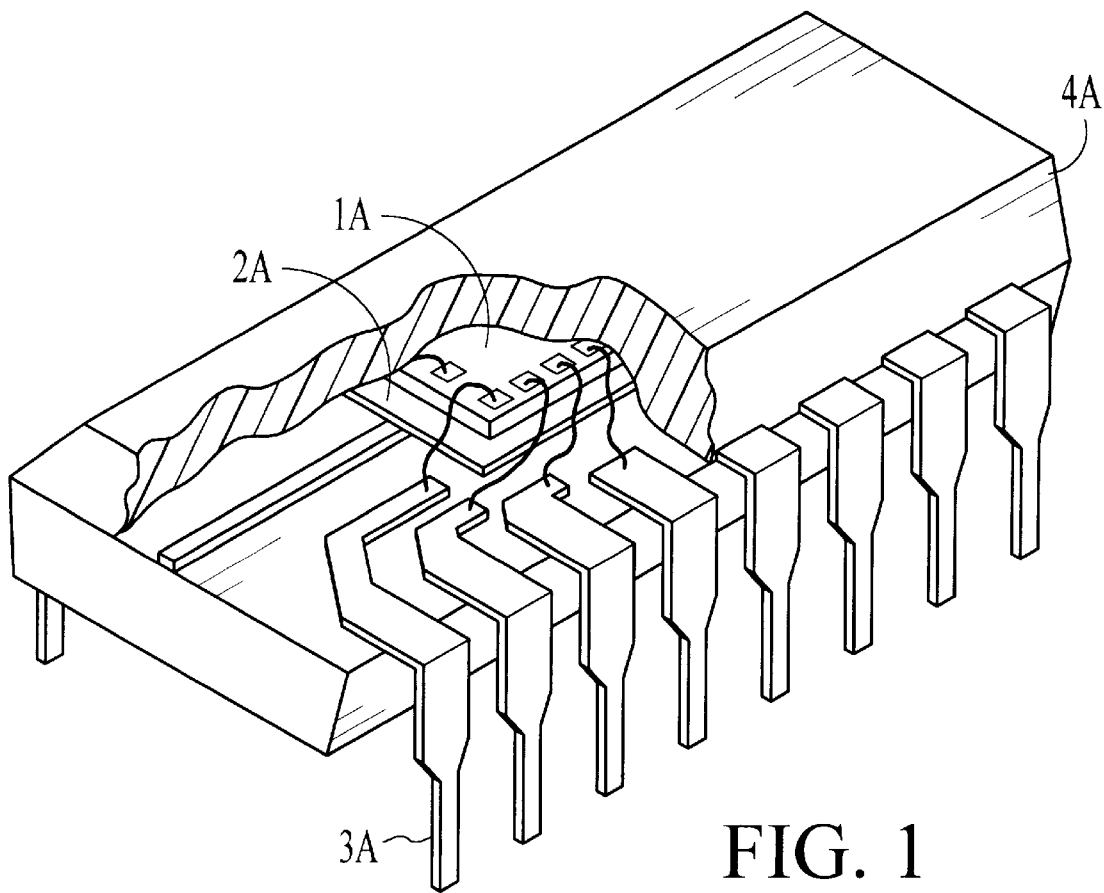
FIG. 1 is a cutaway perspective view of a conventional semiconductor package.
Figure 2:
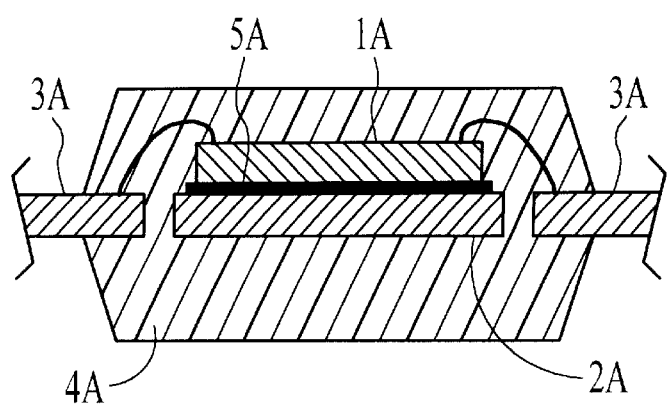
FIG. 2 is a cross sectional view of FIG. 1 along E—E line.
Figure 7:
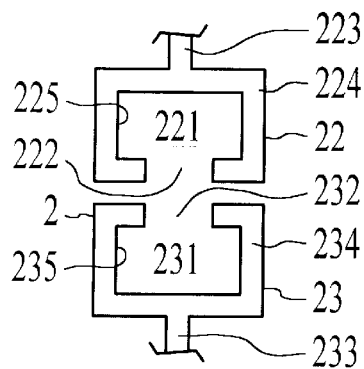
FIG. 7 is a plane view of a die pad of the semiconductor package in Example 1 according to the invention.
Figure 8:
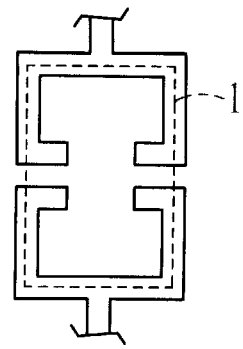
FIG. 8 is a plane view of a die pad of the semiconductor package in Example 1 according to the invention, where a chip is attached to the upper surface of the die pad.
Figure 9:
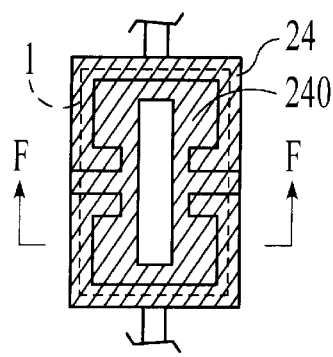
FIG. 9 is a plane view of a die pad of the semiconductor package in Example 1 according to the invention, where an adhesive film is attached to the under surface of the die pad.

As shown in FIGS. 7 to 10, the semiconductor package in the first embodiment of the present invention is comprised of an integrated circuit chip 1 having numbers of bonding pads 11 mounted on its surface; a die pad 2 providing its upper surface for the chip to be attached to, which comprises the first plate 22 and the second plate 23 a space apart; an adhesive film 24 attached to the other surface of the die pad 2; a plurality of leads 3, and a package body 4 to encapsulate the chip 1, die pad 2 and leads 3.

The die pad is in rectangular shape, where the first plate 22 and the second plate 23 are separated by a unspecified distance, depending on the dimension of the whole die pad 2. The first plate 22 and the second plate 23 are positioned in the same extending plane, such that chip 1 can be at the same level and attached to the upper surface 220 (not shown) of the first plate 22 and the second plate 23. Meanwhile, the center parts of the first plate 22 and the second plate 23 form rectangular hollow portions 221 and 231, respectively. There are openings 222 and 232 on the adjacent side of the first plate 22 and the second plate 23 for connecting respectively to the hollow portions 221 and 231. Tie bars 223 and 233 are connected to the opposite side of the openings 222 and 232; the die pad 2 is connected via the tie bars 223 and 233 to a lead frame (not shown) which forms numbers of leads 3. The first plate 22 and the second plate 23 may be made of copper, copper alloy, an alloy of iron and nickel or a combination of these. As the adhesive film 24, produced by polyimide or similar insulating material, is attached to the under surface 224 and 234 of the first plate 22 and the second plate 23, the first plate 22 and the second plate 23 can be kept on the same plane, and the occurrence of elevation or depression can be prevented. Meanwhile, a small hole 240 opens in the center of the adhesive film 24, so that the packaging resin can be injected into hollow portions 221 and 231 of die pad 2 through the hole 240 during the molding process. Hence die pad 2 can be bonded firmly to the molded package body 4. The shape of the hole 240 is not limited and rectangular, circular or polygon shape is equally permissible. There may be more than one hole 240, provided that the size and the position of holes allow the circumference to keep a suitable distance away from the inner walls 225 and 235 of the first plate 22 and the second plate 23. Thus when chip 1 is attached to the die pad 2, bleeding of silver paste 5 (which is used to bond both of them) downwards along inner walls 225 and 235 is stopped by adhesive film 24. Bleeding will thus not contaminate the equipment. The phenomena of secondary delamination resulted from the bleeding of silver paste 5 may also thus be prevented.

Figure 10:
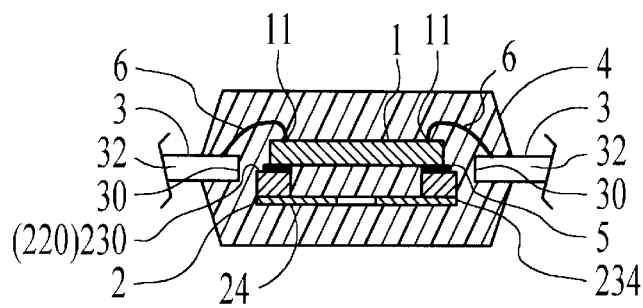
FIG. 10 is a cross sectional view along F—F line of FIG. (9) of the semiconductor package after the molding process.

As shown in FIG. 10, the leads 3 have near end portions 30 and far end portions 32, defined as mentioned above. The leads 3 and chip 1 are connected via wires 6, which electrically attach the near end portions 30 of leads 3 to bonding pads 11 on chip 1. The wires 6 can be made of electrically conductive material such as gold, copper, aluminum or an alloy of these. While the near end portions 30 of the leads 3 are encapsulated into the package body 4, the far end portions 32 are exposed to the exterior surface of the package body 4. Thus, the semiconductor, which is the package of the present invention, can plug into a printed circuit board (not shown) via the far end portions 32.

The packaging of the present invention is carried out according to following steps: 1) die attaching and die curing, 2) wire bonding, 3) molding, 4) marking, 5) post mold curing, 6) de-junk/trimming, 7) solder plating and 8) forming/singulation. That is, chip 1 is first attached to die pad 2 with silver paste 5. After curing at a high temperature of 150° C., both ends of wires 6 are soldered on the near end portions 30 of the leads 3 and on the bonding pads 11 of the chip 1, respectively. The steps of 1) die attaching and 2) wire bonding are then completed.

Subsequently, the semi-finished products finishing 1) die attaching and 2) wire bonding steps are placed into the lower mold of package molding. The upper and lower molds are combined and subjected to the molding and filming of packaging resins. After the 3) molding step is completed, step 4) of marking is carried out on the package. As step 5) of post mold curing to cure the packaging resin, the marking finished package must then be cured at 175° C. for a time of 4 to 8 hours. After finishing step 5), step 6) of de-junk/trimming is processed; then step 7) of solder plating is carried out, treating the surface with an alloy of tin and lead on the portions of leads 3 which are exposed to the exterior of package body 4. After finishing solder plating, the frame portion of the leadframe is cut off. The portion of leads 3 exposed to the exterior of the package is bent into the desired shape. When step 8) of forming/singulation is completed, the packaging of the semiconductor package according to the present invention is finished.

EXAMPLE 2

Figure 11:
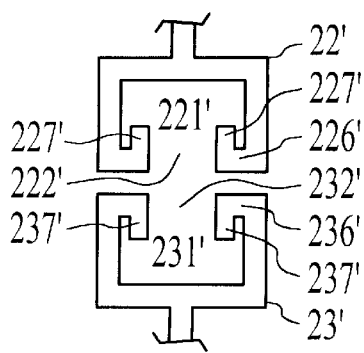
FIG. 11 is a plane view of a die pad of the semiconductor package in Example 2 according to the invention.

FIG. 11 shows the first plate 22' and the second plate 23' of the die pad in the second embodiment of the present invention. The structure of the second embodiment is almost the same as that of the first embodiment, only the pincerlike protrusions 226' and 236' formed on both sides of openings 222' and 232' of the first plate 22' and the second plate 23', further extend inwardly and form ribs 227' and 237' toward the hollow portions 221' and 231' of the first plate 22' and the second plate 23', attaining a better grappling effect between first plate 22, second plate 23' and the package body (not shown).

EXAMPLE 3

Figure 12:
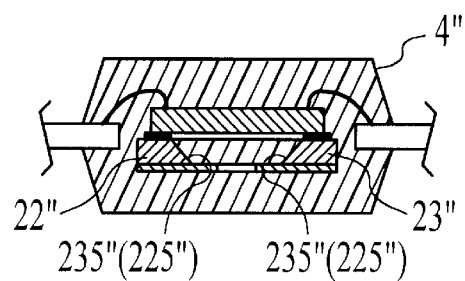
FIG. 12 is a cross sectional view of the semiconductor package in Example 3 according to the invention after the molding process.

FIG. 12 shows the third embodiment of the present invention. The structure of the third embodiment is almost the same as that of the first embodiment, only the inner walls 225" (not shown) and 235" of the first plate 22" (not shown) and second plate 23" have slant angles, in order to enhance the grappling relationship between die pad 2" and package body 4. Besides, as the inner walls 225" and 235" are not limited to slanted wall surface, the wall surfaces can be roughened with the same effects being obtained.

It is known from the above statements that the advantages of the semi-conductor package having a separated die pad according to the present invention are as follows:

1. The hollow portions formed by the first and second plates of the die pad may decrease the stress effect, and reduce the potential for cracking or delamination.
2. The separation of the first and second plates may increase the potential for absorbing stress on the longitudinal direction and prevent any deformation of the die pad such as cracking or delamination resulting from stress.
3. The design in separating the first and second plates of the die pad provide the die pad with enough area to support the chip attached thereon, so the chip will not crack or be damaged during the die attaching process.
4. The use of adhesive film not only enables the first and second plates to be kept on the same plane, but also allows the chip to attached on a level plane to the upper surface of the first and second plates. It also can provide the effect of elastic buffer between the die pad and the package body, thus reducing the stress effect. In addition, said adhesive film is also able to prevent the silver paste, which attaches the chip to the die pad, from bleeding, so the contamination of the equipment or secondary delamination will not occur.
5. The hole opened on the adhesive film enables the packaging resin to enter the hollow portions of the first and second plates during the molding process, thereby developing a good interlock relationship between the die pad and the package body.
6. Since the bleeding problem of the silver paste is resolved by the adhesive film, it is easier to control the pasting amount; therefore, the problem of spaces occurring during the molding process because of not enough pasting will not occur.

The above Examples are intended to illustrate the features and the effects of the present invention, and not to limit the practical forms of this invention. Thus, it will be apparent that any variations or modifications made without departing from the spirit and scope disclosed in the specification of the present invention will be encompassed in the claims disclosed below.

DESCRIPTION OF SYMBOLS

1 Chip
11 Bonding pad
2 Die pad
22 First plate
23 Second plate
24 Adhesive film
220 Upper surface
221 Hollow portion
222 Opening
223 Tie bar
224 Lower surface
225 Inner wall
230 Upper surface
231 Hollow portion
232 Opening
233 Tie bar
234 Lower surface
235 Inner wall
3 Lead
30 Near end portion
32 Far end portion
4 Package body
5 Silver paste
6 Wire
22' First plate
23' Second plate
222' Opening
226' Pincerlike protrusion
227' Rib
232' Opening
236' Pincerlike protrusion
237' Rib
22" First plate
23" Second plate
225" Inner wall
235" Inner wall
4" Package body
221' Hollow Portion
231' Hollow Portion
240 Small Hole
1A Chip
2A Die pad
3A Leads
4A Package body
5A Silver plate

What is claimed is:

1. A semiconductor package, comprising:

an integrated circuit chip having a plurality of bonding pads mounted on its surface;

a die pad providing its upper surface for said chip to be attached to, wherein said die pad comprises first and second plates disposed a space apart, wherein an adhesive film is attached to the under surface of the first and second plates, respectively;

a plurality of leads, wherein the near ends of said leads can be electrically connected to the bonding pads of said chip, whereas the far ends are exposed to the exterior of said semiconductor package; and a package body, wherein said chip, said die pad and said leads including portions of their near ends are encapsulated.

2. A semiconductor package as in claim 1, wherein there are openings on the adjacent side of said first and said second plates for connecting to said hollow portions, such that the segments on both sides of said openings of said first and said second plates from pincerlike protrusions face to face, in order that said first and said second plates can grapple said package body more firmly.

3. A semiconductor package as in claim 1, wherein at least one of the pincerlike protrusions of said first plate forms a rib which extends to the inside of the hollow portion of said first plate, and wherein at least one of the pincerlike protrusions of said second plate forms a rib which extends to the inside of the hollow portion of said second plate.

4. A semiconductor package as in claim 1, wherein the inner walls of said first and said second plates are perpendicular to the extending plane of said first and said second plates.

5. A semiconductor package as in claim 1, wherein the inner walls of said first and said second plates are not perpendicular to the extending plane of said first and said second plates.

6. A semiconductor package as in claim 1, wherein the inner walls of said first and said second plates are roughened.

7. A semiconductor package as in claim 1, wherein the inner walls of said first and said second plates are in arc forms.

8. A semiconductor package as in claim 1, wherein on said adhesive film at least one hole may be opened, such that the packaging material may flow into the hollow portions of said first and said second plates through said hole during the molding process, and wherein a good interlock between said die pad and said package body is provided.

9. A semiconductor package as in claim 1, wherein said die pad is connected to a lead frame, which surrounds the exterior of said die pad, via at least two tie bars.

10. A semiconductor package as in claim 1, wherein said die pad is equipped with a thermal dissipator.

11. A semiconductor package as in claim 1, wherein said lead and said chip are connected via wires, which electrically connect the near end of said lead to the bonding pad of said chip.

12. A semiconductor package as in claim 1, wherein said wires can be made of gold, copper, aluminum or an alloy of these.

13. A semiconductor package as in claim 1, wherein said first and said second plates of said die pad can be made of copper, copper alloy, an alloy of iron and nickel or a combination of these materials.

14. A semiconductor package as in claim 1, wherein said adhesive film is produced by polyimides.

15. A semiconductor package as in claim 1, wherein said package body is produced by phenolic novolac epoxy resin, phenolic epoxy resin or other insulating material.

16. A semiconductor package as in claim 1, wherein said leads are made of electrically conductive material such as copper, copper alloy, or an alloy of iron and nickel, etc.

* * * * *